United States Patent [19]

Hikita

[11] 4,365,220

[45] Dec. 21, 1982

[54] SURFACE WAVE CIRCUIT DEVICE

[75] Inventor: Mitsutaka Hikita, Kokubunji, Japan

[73] Assignee: Hitachi, Ltd., Tokyo, Japan

[21] Appl. No.: 245,748

[22] Filed: Mar. 20, 1981

[30] Foreign Application Priority Data

Mar. 24, 1980 [JP] Japan ................................. 55-36072

[51] Int. Cl.³ .......................... H03H 9/64; H03H 9/25
[52] U.S. Cl. ................................. 333/195; 310/313 C; 333/154; 333/196
[58] Field of Search ............................... 333/150–155, 333/193–196; 310/313 R, 313 A, 313 B, 313 C, 313 D; 331/107 A

[56] References Cited

U.S. PATENT DOCUMENTS 3,768,032 10/1973 Mitchell ............................. 333/154
4,160,963 7/1979 Hays, Jr. ......................... 333/195 X Primary Examiner—Marvin L. Nussbaum
Attorney, Agent, or Firm—Antonelli, Terry and Wands

[57] ABSTRACT

Stripes of a transducer or a reflector in a surface acoustic wave device are arranged such that the distribution of effective lengths of interdigital electrodes follows a function of impulse response in the direction of propagation of an acoustic wave and a total number of stripes in the direction of propagation is equal for each section in the direction normal to the direction of propagation, in order to attain a desired frequency response without sacrificing a transfer efficiency.

9 Claims, 10 Drawing Figures

SURFACE WAVE CIRCUIT DEVICE

BACKGROUND OF THE INVENTION

1. Field of the Invention

The present invention relates to a surface wave circuit device, and more particularly to a structure of an electro-acoustic/acoustic-electrical transducer/reflector used in circuit devices operated in the VHF or UHF frequency band, such as resonators, filters and oscillators, which has conductive metal strips, slits or grooves on a surface of a substrate of piezoelectric material or non-piezoelectric material which can propagate acoustic wave.

2. Description of the Prior Art

In the circuits used in the VHF or UHF frequency band, circuit devices utilizing surface acoustic waves, such as resonators and filters, have been developed to take place of conventional circuit devices utilizing lumped circuit elements such as capacitors, resistors and inductors, and they have been used in communication equipment and television receivers. Although such surface wave circuit devices have many advantages such as small size, stability in operational characteristics, uniformity of device characteristics and economy of cost, they still have problems to be resolved. Specific problems to be resolved are to reduce losses and to attain a desired frequency characteristic.

Primary elements to determine the frequency characteristic of the surface wave circuit device are an acoustic-electrical transducer and a reflector.

The transducer and the reflector include a number of parallelly arranged elongated metal stripes, slits or grooves on a piezoelectric or non-piezoelectric substrate. For the transducer, metal stripes are interleaved and positive and negative voltages are applied thereto or positive and negative voltages are taken therefrom.

In these transducers or reflectors, the following two major approaches have been used to attain desired frequency response. (For the sake of simplicity, a transducer having interdigital electrodes is discussed below.)

FIG. 1 shows a transducer which is known as an apodized transducer. As shown on the left of FIG. 1, two comb-shaped electrodes 1 and 2 are arranged such that stripes (electrode fingers) of one electrode are inserted between stripes of the other electrode with a crossing region of the stripes presenting a function f(x) which approximates an impulse response of the transducer. That is, weighting is effected by crossing region modulation of the electrode fingers of the interdigital electrodes. (A variable x represents a position in the direction of propagation of the surface wave). A transducer shown in FIG. 2 is known as a withdrawal transducer. As shown on the left of FIG. 2, density of electrode pairs presents the function f(x) which approximates the impulse response of the transducer.

The transducer shown in FIG. 1 induces a beam-shaped surface wave close to a Gaussian function as shown by 3 in FIG. 1 which has a larger amplitude at the center of the transducer and a smaller amplitude at upper and lower ends. When the input transducer is an apodized transducer and the output transducer is a conventional unapodized transducer, a lateral length S of the output transducer must be larger than a maximum crossing length J of the electrode fingers of the input transducer in order to enable the receiving transducer to receive all of the transmitted waves, while taking the spread of the acoustic wave due to diffraction into consideration. However, it is known that when the beam-shaped acoustic wave having non-uniform amplitudes is received by an output transducer of large lateral length S, the receiving efficiency (i.e. transfer efficiency in the receiving transducer to transduce acoustic energy to electric energy) is much lower than that when it receives a uniform plane wave. Accordingly, it is difficult to attain a low-loss surface acoustic filter.

In the transducer shown in FIG. 2, the amplitude of the acoustic wave induced by the transducer is a uniform plane wave so that the diffraction of the acoustic wave is small and the receiving efficiency is high. However, since a desired frequency response is to be attained by the withdrawal weighting of the electrode fingers, a large number of electrode pairs of the transducer are required so that the application thereof is usually limited to a narrow band filter. It is inferior to the apodized transducer when a complicated frequency response is desired.

SUMMARY OF THE INVENTION

It is, therefore, an object of the present invention to provide a surface wave circuit device which can attain frequency response which is as good as that of the apodized transducer and which can excite or reflect a uniform plane surface wave having a uniform amplitude in the direction normal to the direction of propagation of the acoustic wave.

In order to achieve the above object and attain a desired frequency response, in accordance with the present invention, a number of stripes are arranged at a constant interval on a surface of a surface wave propagating substrate with the stripes extending in a direction (y-direction) normal to the direction (x-direction) of propagation of the surface wave and with an effective length for the surface propagation function of each stripe at each location of the stripe corresponding to a function f(x) where a variable x is a distance in the x-direction, and with a total number of stripes in the x-direction being substantially equal in every section in the y-direction.

The surface wave propagating substrate herein defined includes a substrate of piezoelectric material such as quartz, $LiNbO_3$ and $ZnO$, and a substrate of non-piezoelectric material such as silicon having a film of piezoelectric material such as $ZnO$ applied thereon. The stripes include conductive thin film stripes such as gold and aluminum, slits formed in the conductive film, and grooves formed in the surface wave propagating substrate. Depending on the applications of the present invention, that is, whether it is used as a transducer or a reflector, the stripes are arranged differently. For the transducer, a number of stripes are arranged in a comb shape and connected to one common electrode while another number of stripes arranged in a comb shape and connected to the other common electrode are interleaved therein.

In the surface wave circuit device of the present invention, since the wavefront of the acoustic wave propagates substantially uniformly by arranging the stripes in the manner described above, the loss due to the diffraction is reduced and the frequency characteristic similar to that of the known apodized surface wave device can be produced.

DESCRIPTION OF THE PREFERRED EMBODIMENTS

Figure 3:
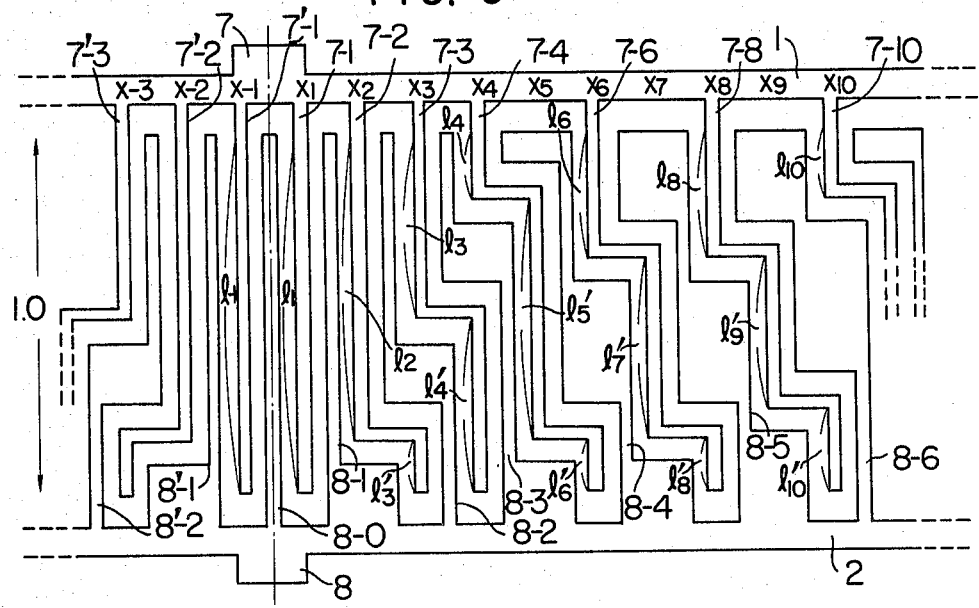
FIGS. 3, 4 and 5 show electrode structures of a transducer constructed by a surface wave circuit device of the present invention.

FIG. 3 shows a structure of one embodiment of a surface acoustic wave device of the present invention, particularly an electro-acoustic transducer and it shows only the arrangement of the stripes (electrode fingers) which is a feature of the present invention. In FIG. 3, numerals 7 and 8 denote electrode terminals to which an input electrical signal is applied. Numerals 1 and 2 denote common electrodes which are connected to the electrode terminals 7 and 8, respectively. Connected to the common electrode 1 are electrode fingers $7'$-3, $7'$-2, $7'$-1, ... 7-8, 7-10 at points $x_{-3}$, $x_{-2}$, $x_{-1}$, $x_1$, $x_2$, $x_3$, ... spaced by in an equidistant manner in the direction of propagation of the acoustic wave (x-direction), which are interleaved with electrode fingers $8'$-2, $8'$-1, 8-0, ... 8-6 connected to the other common electrode 2. The space between the electrode fingers is set to be equal to one half of a wavelength of a center frequency.

The lengths in the y-direction of the stripes or the electrode fingers are equal to each other and the stripes are constructed to present a given frequency response to the transducer. For the sake of explanation, the longest effective length of the stripes is represented by unit 40 to normalize the lengths of the other stripes.

The pass band frequency response of the transducer is represented by a Fourier transform of impulse response as is known in the apodized transducer. Accordingly, it is known that the length of an electrode finger interleaved with an electrode finger of the opposite polarity (i.e. cross length) at point $x_i$ may be selected to be close to a function $f(x_i)$ of the impulse response.

In the present embodiment, in order to achieve the cross length of $f(x_i)$, a stripe having a length of $f(x_i)$ is arranged at point $x_i$ while a stripe having a length $1-f(x_i)$ extends from point $x_i$ and is arranged at point $x_i+1$ so that the total number of the electrode fingers in the x-direction is substantially uniform in every section in the y-direction.

Assuming that $f(x_1)=f(x_{-1})=1$ at points $x_1$ and $x_{-1}$, the cross lengths $l_1$ and $l_{-1}$ of the exciting electrode fingers are selected such that $l_1=f(x_1)=1$ and $l_{-1}=f(x_{-1})=1$ to form the electrode fingers having the cross length of 1. Assuming that $f(x_i)<1$ when $i\geq 1$, the electrode finger for $f(x_2)$ is formed such that the cross length $l_2$ is equal to $f(x_2)$ at point $x_2$ and the remaining length $l'_3=1-l_2$ is arranged at point $x_3$. For $f(x_3)$, since the length $l'_3$ has been arranged at point $x_3$, length $l_3=f(x_3)-l'_3$ is additionally arranged and the remaining length $l'_4=1-l_3$ is arranged at point $x_4$. Similar steps are repeated to attain the desired function $f(x)$ by cross length modulation of the electrode fingers. When $f(x)$ is small, a case may occur where $l_6+l'_7<1$ as is the case of the electrode at point $x_6$. In this case, length $l'_8$ is arranged at point $x_8$.

Figure 1:
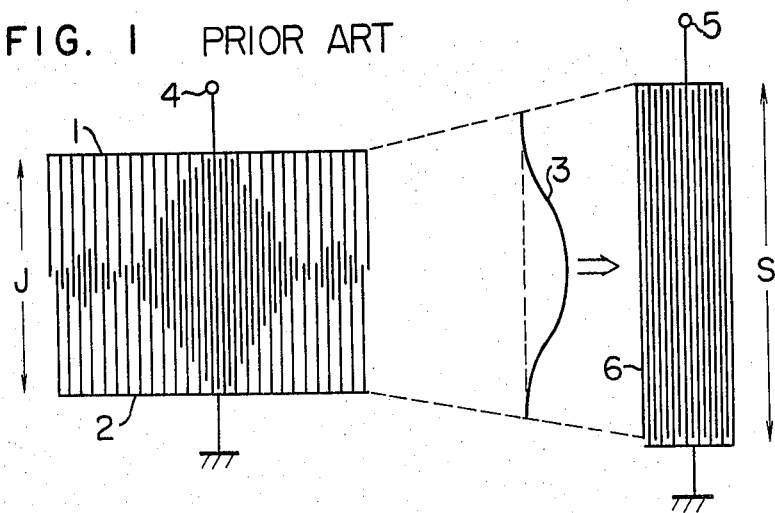
FIGS. 1 and 2 show constructions of prior art surface acoustic wave filters.
Figure 2:
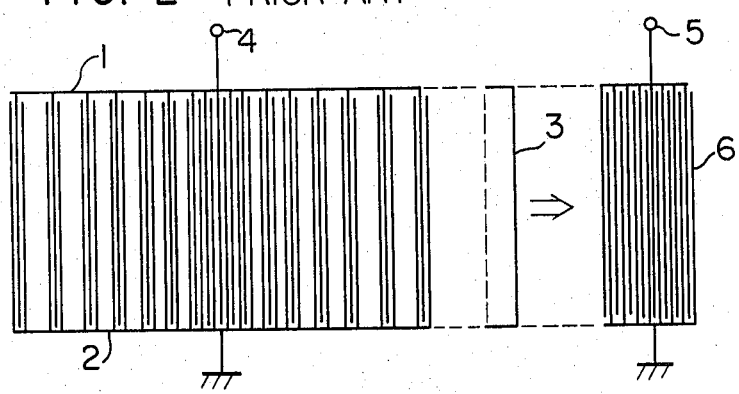

When $f(x)$ has a negative portion, it is attained by inserting a space of one half of a wavelength at a transition point from positive to negative or vice versa as is known in the apodized transducer shown in FIG. 1.

Figure 4:
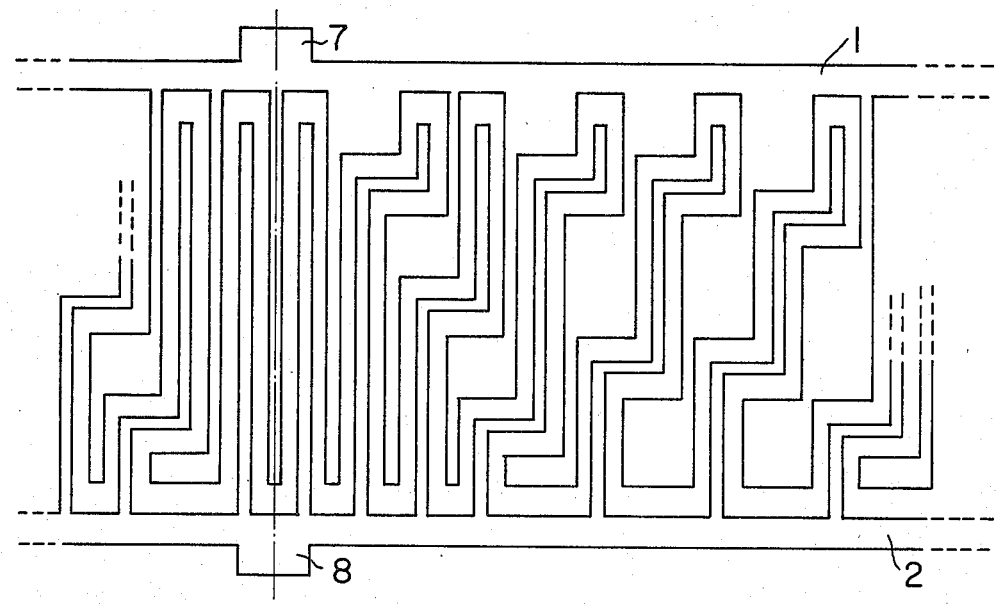
Figure 5:
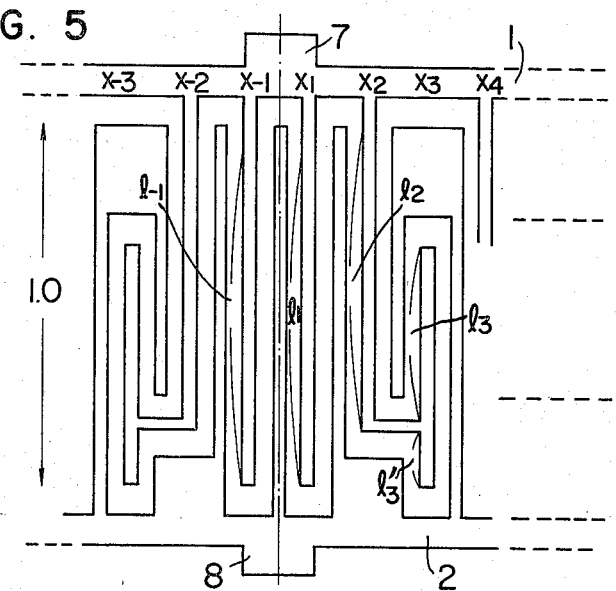

A surface wave excited by the transducer of the embodiment of FIG. 3 has a good approximation to a plane wave within a band of the filter. (Deviation from the plane wave outside the band is insignificant). This will be explained below. A wave excited rightward from the center of the transducer is subjected to excitation over the entire lateral length at point $x_1$. At point $x_2$, however, the length $l_2$ is excited but the remaining length $1-l_2$ is not excited. Accordingly, the wave passed through point $x_2$ has a difference of wavefront between that of the length $l_2$ and that of the length $1-l_2$. The length $l'_3$ at point $x_3$ compensates for it so that the length $l_2+l'_3$ excites a plane wave of substantially uniform wavefront. Similarly, the lengths $l_3+l'_4$, $l_4+l'_5+l'_6$, ... excite plane waves having substantially uniform wavefronts within the band of the filter. Accordingly, the present transducer has the same frequency response as that of the apodized transducer and produces a substantially uniform plane wave which includes less diffraction effect. The structure of the present transducer need not be symmetric lengthwise but it may be point symmetric as shown in FIG. 4 or may even be asymmetric. Further, as shown in FIG. 5, the length $l_3$ may be arranged to extend from the length $l'_3$ instead of being arranged at one end of the transducer. The exciting electrode finger at point $x_4$ is arranged such that an excitation region common to the length $l_3+l'_3$ is minimum. It may be arranged in any way like the length at point $x_3$.

The specific embodiments of the transducer in accordance with the present invention have been described and shown in FIGS. 3, 4 and 5. An important point is that the stripe or the exciting electrode finger at point $x_i$ in FIG. 3 is arranged such that the excitation region common to the electrode finger at point $x_i$ and the exciting electrode finger at point $x_{i-1}$ is minimum. Specifically, for the exciting electrode finger at point $x_3$, since the length $l_2$ is arranged at point $x_2$, the exciting region which is not common to the length $l_2$, that is, the length $l'_3$ is maximized and the common excitation region $l_3=f(x_3)-l'_3$ is minimized. As a result, the distribution of the lengths (effective length) of the stripes or the exciting electrode fingers at the equispaced points $x_i$ approximates to the function $f(x_i)$ of the impulse response and the total number of the electrode fingers in the x-direction is substantially equal in every section in the y-direction.

Figure 6:
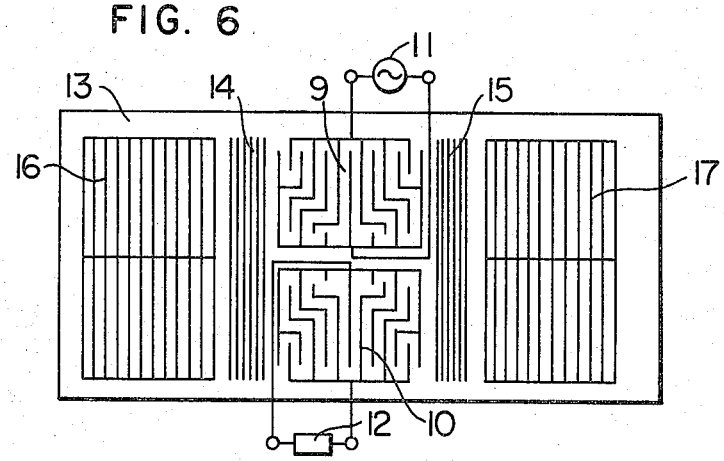
FIGS. 6 and 8 show constructions of embodiments of surface acoustic wave filters which utilize the surface wave circuit device of the present invention.
Figure 7:
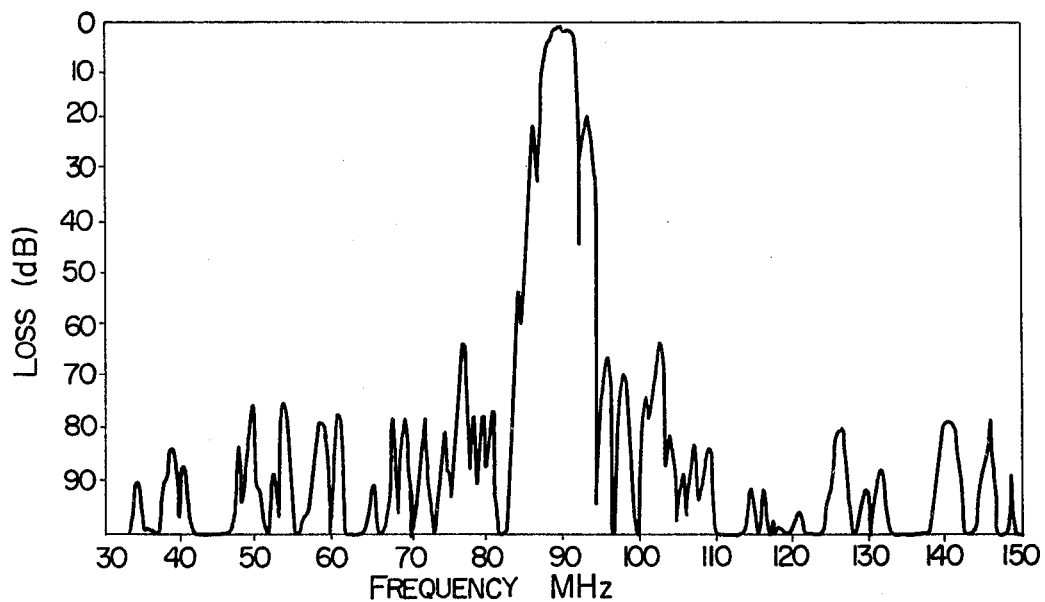
FIG. 7 shows a frequency characteristic of the surface acoustic wave filter shown in FIG. 6.

FIG. 6 shows a construction of a surface acoustic wave filter which uses the transducer shown in FIG. 3, and FIG. 7 shows a frequency response of the filter of FIG. 6. In FIG. 6, an input transducer 9 and an output transducer 10 as shown in FIG. 3 are arranged lengthwise on a substrate of piezoelectric material of 64° rotated Y-cut X-propagation LiNbO$_3$ and an external input excitation source 11 is coupled to the electrodes of the input transducer 9. A load 12 is coupled to the electrodes of the output transducer 10. On the opposite sides facing to the input and output transducers 9 and 10, 3 dB directional couplers 14 and 15 of multistrip structure and reflectors 16 and 17 are arranged. For the sake of simplicity, the stripes forming the transducers, directional couplers and reflectors are shown by lines. The numbers of lines illustrated are smaller than actual numbers. A specific example of constants for a band-pass filter is given below:

center frequency: 90 MHz
percent band width: 4%
dimension of 64° rotated Y-cut X-propagation LiNbO$_3$
   piezoelectric substrate: 6.0 mm×5.0 mm
material of stripes: aluminum
transducers:
   number of stripes: 14 pairs
   spacing: 46.0 μm
   effective length distribution: $f(x)=Ae^{-\alpha x^2}$ where $A=0.8, \alpha=3\times 10^5$
3 dB directional couplers:
   dimension of stripe: 0.35 mm×4.0 mm
   number of stripes: 22
   spacing: 16.0 μm
reflectors:
   dimension of stripe: 0.92 mm ×2.0 mm
   number of stripes: 40
   spacing: 23.0 μm.

A frequency response of the above structure is shown in FIG. 7, in which an abscissa represents a frequency (in MHz) and an ordinate represents attenuation (in dB). As seen from FIG. 7, the attenuation in the pass band is small, i.e. as small as 2-3 dB while the attenuation of more than 50 dB is attained in the stop band.

Figure 8:
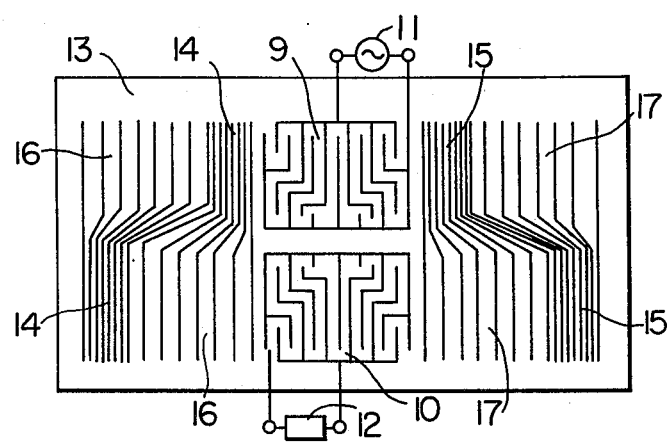

FIG. 8 shows a construction of another embodiment of the surface acoustic wave filter which uses the surface wave circuit devices of the present invention as the tranducers. Principally, it is essentially identical to the embodiment of FIG. 6. In FIG. 8, those represented by like numerals to FIG. 6 have same functions. In the present embodiment, the 3 dB directional coupler and the reflector are integrated. The operation of other portions is identical to that of FIG. 6 and it is not explained here.

While the embodiments which use the surface wave circuit devices of the present invention as the transducers have been shown, the present invention may be applied not only to the transducer but also to the frequency response synthesization of reflectors. The surface wave reflector is usually formed by periodic arrangement of metal stripes. A frequency response of a reflected wave from the periodic arrangement includes a number of side lobes of considerably high level on both sides of a main lobe. In order to eliminate the side lobes, withdrawal of the stripes of the reflector is used but it is not satisfactory to synthesize a desired frequency response. The present invention provides effective means for synthesizing the frequency response of the reflector.

Figure 9A:
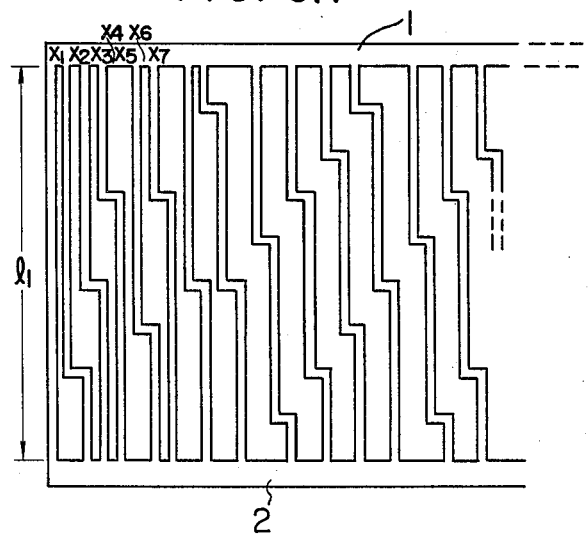
FIGS. 9A and 9B show constructions of embodiments of reflectors constructed by the surface wave circuit device of the present invention.
Figure 9B:
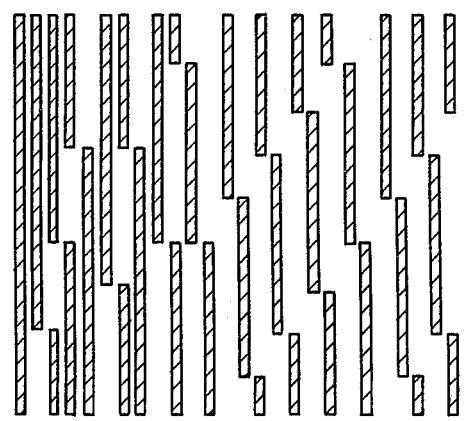

FIGS. 9A and 9B show constructions of embodiments of the reflector. For the sake of simplicity, only the stripes are shown. In FIG. 9A, conductive stripes are arranged on a piezoelectric substrate and the opposite ends of the stripes are coupled together by a common conductor. Like in the transducer shown in FIG. 3, the stripes are arranged such that the effective lengths of the stripes in the direction normal to the direction of propagation of the surface wave at equispaced points $x_1$, $x_2$, ... taken along the direction of propagation follow a function f(x). In the present embodiment, the opposite ends of the stripes are connected to a common electrode.

The common electrode may be eliminated. Whether the common electrode 1 or 2 is used or not depends on a particular application. In general, when a high piezoelectric substrate is used to form a wide band reflector, the opposite ends of the stripes are grounded through the common electrode, and when a low piezoelectric substrate is used to form a relatively narrow band reflector, the common electrode is eliminated to electrically float the stripes.

FIG. 9B shows a construction of another embodiment of the reflector which uses the surface wave circuit device of the present invention. The stripes may be conductive thin films, grooves formed in a surface wave propagating substrate or slits formed in a conductive thin film plate. In the present embodiment, the stripes at respective equispaced points are discrete. While the stripes at each point are shown to comprise one or two stripes, the present invention is not limited to the illustrated embodiment but three or more stripes may be used.

I claim:

1. A surface wave circuit device having a plurality of stripes arranged along a surface wave propagating substrate in a direction normal to a direction of propagation of a surface wave, said stripes being arranged at a fixed spacing from one another along the direction of propagation of a surface wave, wherein each of said stripes has an effective length in the direction normal to said direction of propagation which effective length contributes to the propagation of said surface wave, said effective length for each said stripe being determined as a function of the distance of each said stripe along said direction of propagation from an input point of said surface wave to said plurality of stripes, and further wherein said stripes are arranged such that a total number of stripes in said direction of propagation is substantially constant for any cross-section of said surface wave circuit device taken in said normal direction.

2. A surface wave circuit device according to claim 1, wherein said substrate is made of piezoelectric material and said stripes are conductive thin film strips.

3. A surface wave circuit device according to claim 2, wherein said stripes are connected to adjacent stripes such that the combined lengths of said connected stripes in said normal direction are equal to a predetermined length.

4. A surface wave circuit device according to claim 3, wherein said stripes comprise two groups each connected to a common electrode, the stripes of one group being interleaved with the stripes of the other group.

5. A surface wave circuit device according to claim 3, wherein the opposite ends of said stripes are connected together.

6. A surface wave circuit device according to claim 1, wherein said stripes are conductive thin films.

7. A surface wave circuit device according to claim 1, wherein said stripes are slits formed in a conductive thin film plate.

8. A surface wave circuit device according to claim 1, wherein said stripes are grooves formed in said substrate.

9. A surface wave circuit device according to claim 1, wherein said effective lengths are set in accordance with said function of distance to propagate substantially uniform wavefronts for said surface wave within a frequency bandwidth of said surface wave circuit device.

* * * * *